United States Patent [19]
Kizaki

[11] 4,266,156
[45] May 5, 1981

[54] SUBMINIATURE PIEZOELECTRIC QUARTZ VIBRATOR

[75] Inventor: Shigeru Kizaki, Hanno, Japan

[73] Assignee: Citizen Watch Company Limited, Tokyo, Japan

[21] Appl. No.: 958,853

[22] Filed: Nov. 7, 1978

[30] Foreign Application Priority Data

Nov. 15, 1977 [JP] Japan .................................. 52-136843

[51] Int. Cl.³ ............................................ H01L 41/08
[52] U.S. Cl. .................................. 310/344; 310/317; 310/348; 310/364
[58] Field of Search ............... 310/344, 348, 370, 318, 310/312, 320, 351, 352, 353, 364, 319

[56] References Cited

U.S. PATENT DOCUMENTS

| | | |
|---|---|---|
| 2,095,376 | 10/1937 | Bechmann .............................. 310/364 |
| 2,497,666 | 2/1950 | Gravley ................................ 310/364 |
| 3,173,035 | 3/1965 | Fisher .................................. 310/344 |
| 3,969,640 | 7/1976 | Staudte ................................ 310/370 |
| 3,970,880 | 7/1976 | Deutschmann .................. 310/353 X |
| 4,191,905 | 3/1980 | Yasuda et al. ........................ 310/344 |

FOREIGN PATENT DOCUMENTS

1027735 4/1958 Fed. Rep. of Germany ........... 310/312
2314901 10/1973 Fed. Rep. of Germany ........... 310/352

*Primary Examiner*—Mark O. Budd
*Attorney, Agent, or Firm*—Jordan and Hamburg

[57] ABSTRACT

A piezoelectric vibrator comprises a housing including a planar insulating substrate having thin film terminals. An insulating layer is provided on the thin film terminals and has a thickness of less than 100 microns, with the thickness of the insulating layer being less than ½ the width of the thin film terminals.

8 Claims, 11 Drawing Figures

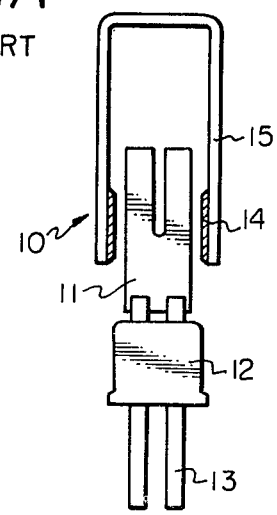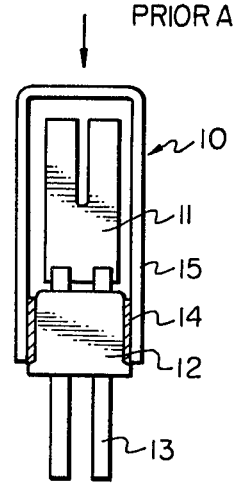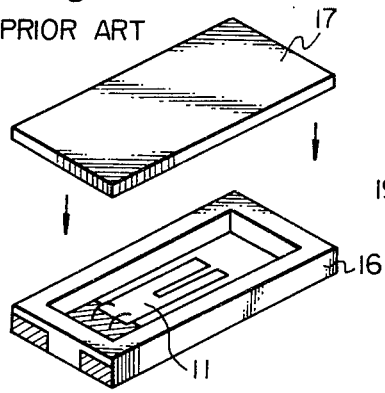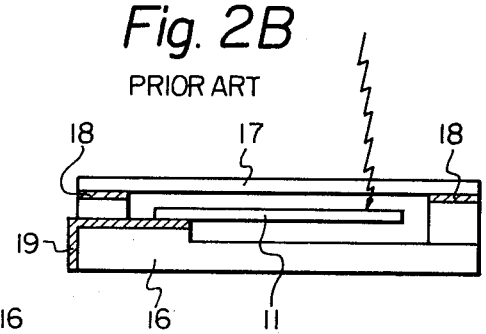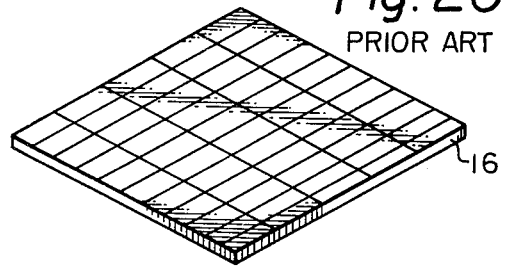

Fig. 4
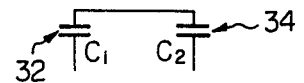
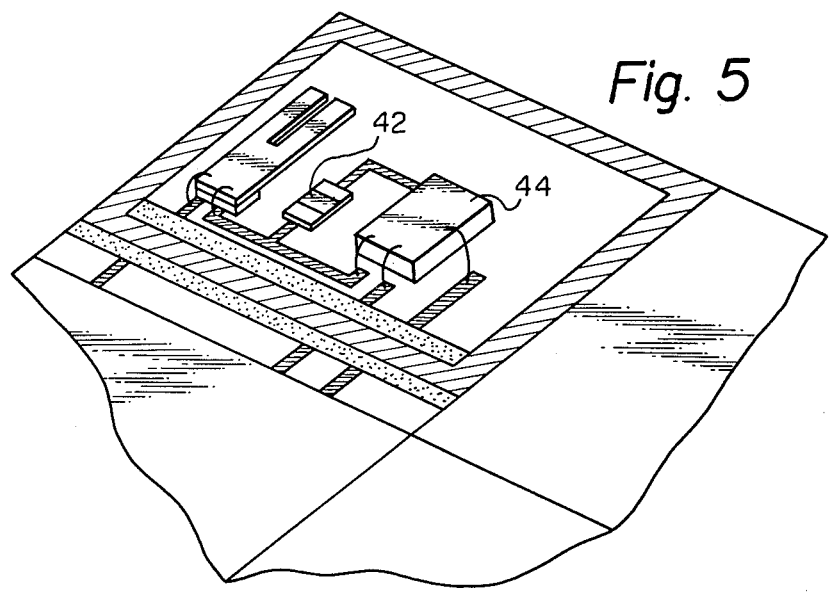
Fig. 5
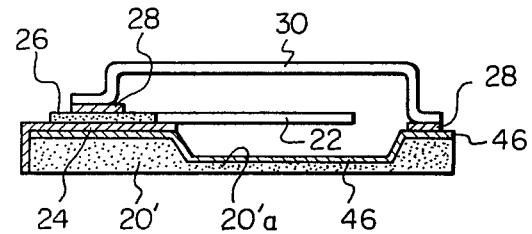
Fig. 6

SUBMINIATURE PIEZOELECTRIC QUARTZ VIBRATOR

This invention relates to a subminiature piezoelectric vibrator, and seeks to reduce the capacitance that develops between the terminals of a vibrator housing and affects the characteristics of the vibrator.

Quartz crystal vibrators have recently come into general use for the purpose of providing a time standard signal in electronic wristwatches. The quartz crystal vibrators which are employed in these wristwatches are of the bar type or tuning fork type since such low frequency flexural mode vibrators are small in size and capable of being driven with little consumption of power. Casings for these vibrators have been prepared by various methods each possessing its own advantages and disadvantages. One method adopts a cold sealing technique in which a cap is press fitted through a hermetic seal or through the use of cold welding, while according to another method a ceramic green sheet is sintered and a transparent glass heated and sealed such as by soldering, with the frequency tuning of the vibrator being accomplished by means of a laser beam which is projected through the transparent glass.

It is therefore an object of the present invention to provide an improved housing for a piezoelectric vibrator which overcomes the shortcomings encountered in prior art.

It is another object of the present invention to provide an improved housing for a piezoelectric vibrator, which housing is simple in construction, suitable for mass production and does not adversly affect the operating characteristics of the vibrator.

In the accompanying drawings, in which:

FIGS. 1A and 1B are exploded cross-sectional views of a conventional cylindrical case which makes use of a hermetic seal for a vibrator;

FIGS. 2A and 2B are perspective and exploded cross-sectional view, respectively, of a ceramic package for a vibrator;

FIG. 2C is a diagram useful for explaining a method of fabricating the ceramic package shown in FIGS. 2A and 2B;

FIG. 4 is an equivalent circuit of the construction shown in FIG. 3C;

FIG. 5 is a diagram useful for explaining another embodiment of the present invention; and FIG. 6 is a cross-sectional view of another preferred embodiment of a piezoelectric vibrator according to the present invention.

Figure 3A:
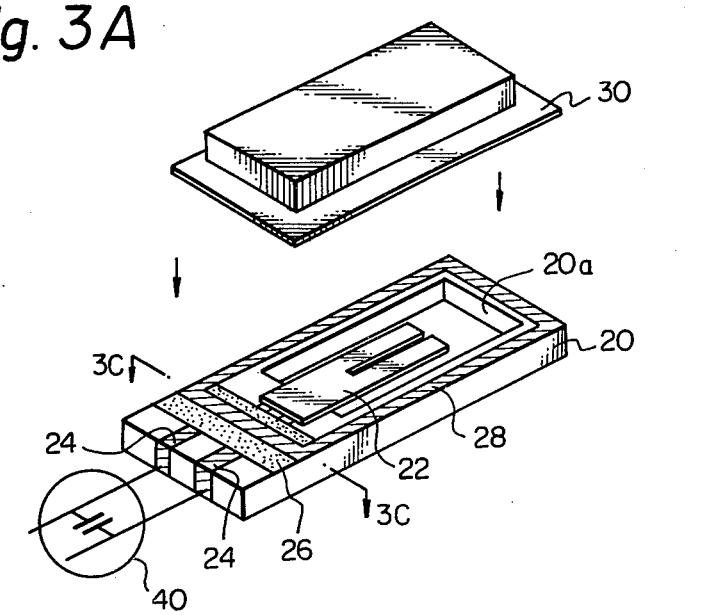
FIG. 3A is a perspective view of a preferred embodiment of a piezoelectric vibrator according to the present invention.

FIGS. 1A and 1B are cross-sectional views showing the principal portions of a sealing structure according to the prior art. A crystal vibrator 10 comprises a vibrating element 11 in the form of a tuning fork which is mounted on a hermetic seal 12, and a metal cap or casing 15 is provided with a soft metal 14 such as Sn, Pb-Sn or In. The metal cap 15 is cold-fitted onto the hermetic seal 12 by applying pressure in the direction of the arrow shown in FIG. 1B. The housing of this type is disadvantageous in that lead wires 13 extending through the hermetic seal 12 are sealed and secured by a glass button consisting of press molded powdered glass, a process in which assembly is difficult owing to the small size of the components. Another defect is the problem of precise assembly of the overall subminiature structure. Nevertheless, this method also possesses a number of advantages, specifically the fact that press fitting the cap under cold conditions does not expose the vibrator to the effects of heat so that there is very little shift in frequency at the time that sealing is accomplished.

On the other hand, a vibrator housing making use of a ceramic material as shown in FIGS. 2A, 2B and 2C, employs a transparent plate 17 that allows a laser beam to be projected in the direction of the arrow in order to tune the frequency of the tuning fork vibrator by trimming a metal weight which has been provided on the tines of the tuning fork. This is one advantage since a trimmer condenser need not be provided. Another is that a large number of the housing can be obtained from a single ceramic sheet, as shown in FIG. 2C, thus making batch fabrication possible. On the minus side, however, is the fact that the ceramic is highly porous and vigorously adsorbs gases, thus having a detrimental effect upon the aging of the vibrator. Another defect is that a thin ceramic plate can not guarantee that a vacuum will be maintained.

It is obvious from the foregoing that the conventional containers for a subminiature vibrator possessed disadvantages as well as advantages and therefore were not perfectly suited for housing such vibrators.

To overcome the shortcomings encountered in the prior art, the present invention contemplates the provision of a quartz crystal vibrator, which comprises an insulating substrate which does not readily adsorb gases. A terminal portions are formed on the substrate by vacuum deposition or screen printing to provide metal films, which are shaped into film leads. An insulating or protecting layer is provided on the leads and a fusible metallic material such as solder which exhibits a low melting point is provided on the insulating layer. This structure makes batch fabrication possible so that a large number of housings can be simultaneously obtained from a single planar insulating substrate. This makes it possible to obtain an extremely thin insulating layer by the vacuum deposition of SiO, for example, or by using screen printing or a similar technique to form a thin layer of glass having a low melting point. However, widening the width of the film leads and reducing the thickness of the insulating layer to an extreme extent is disadvantageous since this will increase the capacitance between the terminals, a major problem in so far as the housing is concerned. Therefore, in accordance with the present invention, the relation between the thickness of the insulating layer and the width of the film lead is adjusted so that the capacitance between the terminals will not affect the vibrator characteristics.

A more detailed description of a preferred embodiment of the present invention will now be had with reference to FIG. 3.

Figure 3B:
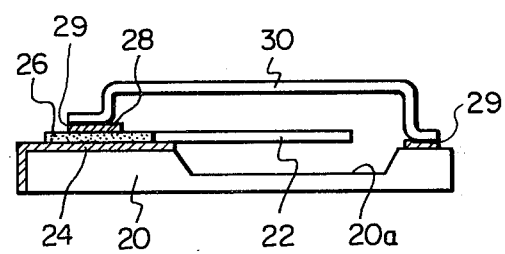
FIGS. 3B and 3C are cross-sectional views of the embodiment shown in FIG. 3A.

Referring now to FIGS. 3A and 3B, a planar glass substrate 20 is used as the insulating substrate and provided with a recessed portion 20a by etching or a similar process so that a free space is defined between the substrate 20 and a piezoelectric vibrator element 22. In leading out the electrodes of the vibrator 22 to a point outside of the package, vacuum deposition or a similar technique is used to form a multi-layered metal film over the entire surface of the glass substrate and photoetching technique is then employed to provide a planar pattern which serves as film leads 24. An insulating layer 26 consisting of SiO, $SiO_2$ or the like is then vacuum deposited on the film leads 24 and a metal mask or the like is used when forming the insulating layer into a pattern. Alternatively, a phosphorus silicate glass film or film of $SiO_2$ may be formed on the entire surface of the substrate 20 by chemical vapor deposition and, thereafter, a desired pattern is formed by a photoetching technique. Next, a multi-layered metal film is formed over the entire surface of the layer 26 by vacuum deposition and photoetching is employed to form the metal film into a pattern which serves as a metallized layer 28. The metallized layer 28 and a cover 30 are then heated and sealed together vacuum, by means of a layer of fusible metallic material 29 fused between the cover and the metallized layer 28. Layer 29 can consist of solder, for example. This process makes it possible to obtain the glass package adopted in the present invention. According to this process a large number of the glass housings can be formed on a single sheet of planar glass and the transportation, washing and inspection following mounting of the vibrators is facilitated, thus enhancing efficiency. Still another advantage is the fact that the glass adsorbs little gas and therefore does not contribute to the aging of the vibrator.

Since the insulating film 26 is extremely thin there is a limit upon the extent to which the width of the film leads can be reduced in order to minimize the capacitance, since a reduction of the width of a film lead below a certain minimum value will result in an unacceptable value of resistance in the lead, if a thin film lead of conventional constructions is used. However, according to the present invention, the thin film lead width can be reduced through the adoption of film leads obtained by laminating a metal film that reinforces the adhesion to the glass and a metal film that has good electrical conductivity.

Figure 3C:
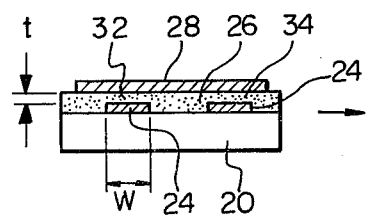

FIG. 3C is a cross-sectional view taken along the line 3C—3C' of FIG. 3A, and FIG. 4 shows an equivalent circuit diagram of the capacitance which develops in the vibrator of FIG. 3C. Although the insulating layer 26 is formed between the two film leads 24 and the metallized layer 28, capacitances $C_1$, $C_2$ develop at intermediate regions 32, 34 between the metallized layer 28 and the film leads 24. This is illustrated in the equivalent circuit diagram of FIG. 4. Since this is equivalent to a series connection, the capacitances $C_1$, $C_2$ are reduced by half, namely to $C_1/2$, $C_2/2$ at the portion between the terminals having the capacitance 40 (see FIG. 3A). In the case of the quartz crystal vibrator used in the frequency standard oscillator circuit of an electronic timepiece, it is necessary to limit the capacitance between the leads of the quartz crystal vibrator to a value of 1pF or less.

The results of experiments have shown that, when an insulating layer 26 of SiO was deposited to provide a thickness t between the film leads 24 and metallized layer 28 of 5 microns by a vapor deposition technique or similar technique while the width w of the film lead 24 was set at 100 microns, in other words, when $t/w = 1/20$, the capacitance 40 between the terminals was 1 PF or less. Furthermore it was possible to obtain a film lead width in the vicinity of 200 microns in a case where a 50 to 100 micron insulating layer 26 was formed using glass of a low melting point.

According to the present invention, if thin film planar terminals are formed on a planar glass substrate, the thickness t of the insulating layer can be set to less than 100 microns and its width to a value equal to one half the width of a thin film lead, or even lower. Even with such a low value for the thickness of the insulating layer, the capacitance between the terminals of a piezoelectric vibrator constructed according to the present invention can be held to a value of 1pF or less. The operation of an oscillator circuit coupled to the piezoelectric vibrator will not be adversely affexted by such a low value of lead capacitance. Adopting the present invention thus permits highly precise mass production of housing for piezoelectric vibrators which can be batch fabricated.

FIG. 5 illustrates another embodiment of the present invention in which planar terminals of the type described can be used for the connection of a thin film capacitor 42 or integrated circuit 44.

FIG. 6 shows another preferred embodiment of a quartz crystal vibrator according to the present invention, with the like or corresponding parts being assigned the same reference numerals as those used in FIG. 3B. In the embodiment of FIG. 6, a ceramic substrate 20' has a recess 20'a and an insulating layer 46 consisting of a film of $SiO_2$ is formed on the entire surface of an upper side of the substrate 20' by any suitable technique such as vacuum evaporation. The terminal leads 24, insulating layer 26 and metallized layer 28 are formed in the same manner as previously noted with reference to FIG. 3B. Thus, in the embodiment of FIG. 6, since the ceramic substrate 20' is coated with a protecting layer 46, the ceramic substrate 20' does not absorb gases to prevent detrimental effect upon the aging of the vibrator. Also, a vacuum is maintained within the housing in a highly reliable manner.

While the present invention has been shown and described with reference to particular embodiments, it should be noted that various other changes or modifications may be made without departing from the scope of the present invention.

What is claimed is:

1. A piezoelectric vibrator comprising:
   an insulating substrate having a recessed portion formed on an upper side thereof;
   thin film leads formed on a portion of said upper side of the insulating substrate;
   a piezoelectric vibrator element mounted on a periphery of said recessed portion of said upper side of the insulating substrate and separated by fixed distances from surfaces of said recessed portion, said piezoelectric vibrator element being electrically connected to said thin film leads;
   an insulating layer formed on and partially covering said thin film leads and areas of said upper side of said insulating substrate adjacent to said thin film leads;
   a metallized layer formed on the upper side of said insulating substrate and over a part of said insulating layer;
   a cover mounted on said metallized layer to enclose said piezoelectric vibrating element; and
   a layer of fusible metallic material fused between said metallized layer and said cover, for attaching said cover to said metallized layer and for hermetically sealing said piezoelectric vibrator element within said cover;
   said insulating layer having a thickness less than 200 microns, with the thickness of said insulating layer being less than ½ the width of each of said thin film leads, whereby a capacitance develops at each of intermediate portions between said metallized layer and said thin film leads.

2. A piezoelectric vibrator according to claim 1, in which said insulating substrate comprises a planar glass substrate.

3. A piezoelectric vibrator according to claim 2, in which said insulating substrate comprises a ceramic substrate, and further comprising a protecting layer formed on the entire surface of an upper side of said ceramic substrate.

4. A piezoelectric vibrator according to claim 3, in which each of said thin film leads is formed of an integrally combined upper metallic layer and lower metallic layer, said lower metallic layer being formed directly on a surface of said upper side of said insulating substrate and said upper metallic layer being formed on said lower metallic layer, said upper metallic layer being composed of a metallic material having high electrical conductivity.

5. A piezoelectric vibrator according to claim 1, in which said insulating layer is composed of silicon oxide.

6. A piezoelectric vibrator according to claim 1, in which said insulating layer is composed of a glass material.

7. A piezoelectric vibrator comprising:
an insulating substrate having a recessed portion formed on an upper side thereof;
thin film leads formed on a portion of said upper side of the insulating substrate, each of said thin film leads being composed of an upper metallic layer and lower metallic layer, said lower metallic layer being formed directly on a surface of said upper side of said insulating substrate and said upper metallic layer being formed on said lower metallic layer, said upper metallic layer being composed of a metallic material having a high electrical conductivity;
a piezoelectric vibrator element mounted on a periphery of said recessed portion of said upper side of the insulating substrate and separated by fixed distances from surfaces of said recessed portion, said piezoelectric vibrator element being electrically connected to said thin film leads;
an insulating layer formed on and partially covering said thin film leads and areas of said upper side of said insulating substrate adjacent to said thin film leads, said insulating layer being composed of silicon oxide;
a metallized layer formed on the upper side of said insulating substrate and over a part of said insulating layer;
a cover mounted on said metallized layer to enclose said piezoelectric vibrating element; and
a layer of fusible metallic material fused between said metallized layer and said cover, for attaching said cover to said metallized layer and for hermetically sealing said piezoelectric vibrator element within said cover;
each of said thin film leads having the maximum width which is substantially equal to 100 microns;
said insulating layer having the maximum thickness which is no greater than one half of said maximum width of a thin film lead.

8. A piezoelectric vibrator comprising, in combination:
an insulating substrate having a recessed portion formed on an upper side thereof;
thin film leads formed on a portion of said upper side of the insulating substrate, each of said thin film leads being composed of an upper metallic layer and a lower metallic layer, said lower metallic layer being formed directly on a surface of said upper side of said insulating substrate and said upper metallic layer being formed on said lower metallic layer, said upper metallic layer being composed of a metallic material having a high conductivity;
a piezoelectric vibrator element mounted on a periphery of said recessed portion of said upper side of the insulating substrate and separated by fixed distances from surfaces of said recessed portion, said piezoelectric vibrator element being electrically connected to said thin film leads;
an insulating layer formed on and partially covering said thin film leads and areas of said upper side of said insulating substrate adjacent to said thin film leads, said insulating layer being composed of a glass material;
a metallized layer formed on the upper side of said insulating substrate and over a part of said insulating layer;
a cover mounted on said metallized layer to enclose said piezoelectric vibrating element; and
a layer of fusible metallic material fused between said metallized layer and said cover, for attaching said cover to said metallized layer and for hermetically sealing said piezoelectric vibrator element within said cover;
each of said thin film leads having the maximum width which is substantially equal to 200 microns;
said insulating layer having the maximum thickness which is no greater than one half of said maximum width of a thin film lead.

* * * * *